United States Patent [19]
Ichikawa et al.

[11] Patent Number: 6,054,751
[45] Date of Patent: Apr. 25, 2000

[54] SEMICONDUCTOR INTEGRATED CIRCUIT

[75] Inventors: Kouji Ichikawa, Obu; Hiroshi Fujii, Nukata-gun; Susumu Tsuruta; Hideaki Ishihara, both of Okazaki, all of Japan

[73] Assignee: Denso Corporation, Kariya, Japan

[21] Appl. No.: 08/932,623

[22] Filed: Sep. 17, 1997

[30] Foreign Application Priority Data

Sep. 18, 1996 [JP] Japan ................................ 8-246394

[51] Int. Cl.⁷ ............................................ H01L 29/00
[52] U.S. Cl. ........................... 257/532; 257/379; 257/758
[58] Field of Search ................................ 257/532, 379, 257/758

[56] References Cited

U.S. PATENT DOCUMENTS 5,202,751  4/1993  Horiguchi ............................... 257/532
5,631,492  5/1997  Ramus et al. ........................... 257/532

FOREIGN PATENT DOCUMENTS 60-161655  8/1985  Japan .
61-61437   3/1986  Japan .
4-257256   9/1992  Japan .

*Primary Examiner*—Mark V. Prenty
*Attorney, Agent, or Firm*—Pillsbury Madison & Sutro LLP

[57] ABSTRACT

In an integrated circuit in which function blocks constituting a CPU block, a memory block and the like, a power supply line for supplying power to the function blocks, and multiple signal lines for inputting and outputting signals to and from the function blocks are formed on a semiconductor substrate, bypass capacitors are provided on the power supply line in proximity to or inside the function blocks. The capacitances of these bypass capacitors are set in correspondence with the consumed current characteristics of the respective function blocks. As a result, noise produced on the power supply line by the operation of the function blocks can be suppressed and it is possible to certainly prevent such noise from leaking out through power supply terminals and input/output terminals of the integrated circuit to the outside.

11 Claims, 5 Drawing Sheets

SEMICONDUCTOR INTEGRATED CIRCUIT

CROSS REFERENCE TO RELATED APPLICATION

This application is based upon and claims the benefit of priority of the prior Japanese Patent application Ser. No. H.8-246394 filed on Sep. 18, 1997, the contents of which are incorporated herein by reference.

BACKGROUND OF THE INVENTION

1. Field of the Invention

This invention relates to a semiconductor integrated circuit in which electronic circuits constituting a CPU, a memory and so on are formed on a semiconductor substrate while the electronic circuits are separated by their functions to form a plurality of function blocks, and particularly to a semiconductor integrated circuit capable of preventing power supply noise produced as a result of the operation of these function blocks from leaking to the outside.

2. Related Art

Japanese Patent application Laid-open No.60-161655 proposes a semiconductor device wherein a power supply line inside an integrated circuit (hereinafter, referred to as 'IC') is used as one electrode and a diffusion layer formed in a semiconductor substrate along this power supply line is used as another electrode to form capacitance therebetween. The power supply line is formed on the semiconductor substrate through an insulating layer and connected to a ground line. The semiconductor substrate is supplied with a power source voltage by way of a power source line. Therefore, capacitance is provided between the power source line and the ground line. This capacitance is utilized as a part of a bypass capacitor. In this proposed device, because it is possible to provide a bypass capacitor directly on the power supply line inside the IC, fluctuations in power supply line potential occurring at times of on/off transition of transistors inside the IC (i.e. power supply noise) can to some extent be suppressed.

However, just by simply providing a bypass capacitor along the power supply line inside the IC as in the proposed device, it is not possible to certainly prevent the power supply noise generated inside the IC. As a result, it is not possible to fully solve problems such as high-frequency noise leaking from the IC to the outside and the malfunctioning of circuits inside the IC caused by the power supply noise. In more detail, in an IC, generally, numerous function blocks such as a CPU block, an oscillating circuit block, a memory block, an input-output interface block, and so on are disposed dispersed on a semiconductor substrate. These function blocks each constitute a generating source of power supply noise. Consequently, even if a bypass capacitor is just formed along a power supply line connected to the dispersed function blocks as described above, when being seen from a function block having produced power supply noise, capacitance is also dispersed along the power supply line. As a result, with influence of the impedance of the power supply line, the capacitance cannot fully absorb the power supply noise. Therefore, the power supply noise generated in one function block is inputted into other function blocks through the power supply line or signal lines and has an adverse influence on the operation of these other function blocks.

If the capacitance of a bypass capacitor disposed on the power supply line is made large enough, it is possible to suppress the occurrence of power supply noise. In this case, however, to obtain the capacitance necessary for suppression of the power supply noise it is necessary to increase the capacitance taking into account the influence of the impedance of the power supply line. Therefore, capacitance which is considerably large must be formed to suppress the power supply noise, and consequently the rate of occurrence of defects rises and yield deteriorates.

That is, to reduce power supply noise by providing bypass capacitors on the power supply line while maintaining the reliability of the IC it is necessary to provide the capacitors of the right capacitance in the right location, and just disposing bypass capacitors at random as in the proposed device as mentioned above is not sufficient.

SUMMARY OF THE INVENTION

It is therefore an object of this invention to solve the problems described above and provide a semiconductor integrated circuit which can suppress power supply noise produced in a plurality of function blocks without the reliability of the semiconductor integrated circuit being deteriorated.

To achieve the above-mentioned object and other objects, in a semiconductor integrated circuit according to the present invention, a plurality of function blocks constituted by electronic circuits each of which exhibits a specific function, a power supply line for supplying power to the function blocks, and signal lines for inputting and outputting signals to and from the function blocks are formed on a semiconductor substrate. Also, each function block is provided with a bypass capacitor connected to the power supply line. This bypass capacitor is formed in proximity to or inside the respective function block using an electrode different from the power supply line.

Therefore, with a semiconductor integrated circuit of the present invention, because a bypass capacitor is provided in proximity to or inside each of the function blocks using the electrode different from the power supply line, it is possible to connect the bypass capacitors to the function blocks, which are sources of power supply noise, with line impedance minimized. As a result, it is possible to certainly absorb power supply noise generated in each of the function blocks.

As a result, power supply noise (high-frequency noise) does not pass from the function blocks through the power supply line or signal lines into other function blocks. The function blocks can operate normally at all times without suffering affects of power supply noise. Also, because power supply noise is thus not outputted from each of the function blocks, there is also no leaking out of high-frequency noise through the power supply line or signal lines from the IC to the outside. Therefore, with this present invention, it is possible to realize a semiconductor integrated circuit which does not produce high-frequency noise and which also has stable operating characteristics.

Also, the capacitance of the bypass capacitor provided for each of the function blocks can be limited to the capacitance needed to absorb the power supply noise produced by the operation of the corresponding function block. Therefore, it is possible to prevent the capacitance being excessively large and the reliability of the semiconductor integrated circuit from deteriorating.

That is, as already mentioned, in a semiconductor integrated circuit, when a capacitor is formed with a power supply line as one of its electrodes, an excessively large capacitance has to be formed, and defective devices are more liable to arise. However, with the present invention, because it is possible to connect bypass capacitors to the function blocks with line impedance minimized, their capacitance can be kept to the minimum necessary and it is possible to prevent the capacitance of the bypass capacitors from being excessively large and the rate of occurrence of defective devices from rising.

Therefore, according to the present invention, it becomes possible to manufacture without reducing yield a semiconductor integrated circuit which operates stably at all times without producing high-frequency noise.

The electrodes constituting the bypass capacitors can be disposed in the interconnection region between the function blocks. Below the interconnection region between the function blocks, no semiconductor devices such as MOS transistors or ROM are formed, and it is an empty region. If bypass capacitors are formed in this empty region, it is possible to provide bypass capacitors with almost no increase in the area of the integrated circuit. Also, because an empty region is being utilized, the locations and sizes of the bypass capacitors can be set freely.

To provide a bypass capacitor on a power supply line formed on a semiconductor substrate, a bypass capacitor employing the power supply line as an electrode can be established by forming a diffusion layer along the power supply line, as in the device disclosed in the above-mentioned related art publication. However, when a bypass capacitor is made by using a diffusion layer in this way, the bypass capacitor can be formed only in the power supply line region on the semiconductor substrate, and thus the location of the bypass capacitor is limited. Also, in this case, because it is difficult to provide the necessary capacitance with just an ordinary power supply line region, it may be necessary to enlarge the power supply line region to secure the necessary capacitance. If the power supply line region is enlarged, it is necessary to increase the area of the semiconductor substrate, and this results in increased size and cost of the semiconductor integrated circuit.

That is, when, as in the device disclosed in the above-mentioned related art publication, a bypass capacitor is made by using a diffusion layer, it is difficult to make a bypass capacitor of the necessary capacitance in the right place, and the freedom of circuit design is low.

To contrary, when a bypass capacitor is formed in an interconnection region between the function blocks, it becomes possible to select the location of the bypass capacitor freely and it is not necessary to increase the area of the semiconductor substrate in order to secure its capacitance.

Therefore, it becomes possible to provide a bypass capacitor of the necessary capacitance in the necessary place for each of the function blocks in the semiconductor integrated circuit, and the degree of freedom of circuit design can be increased.

It is particularly preferable for oscillating circuit blocks and input-output interface blocks to be provided with bypass capacitors. Measurements carried out by the present inventors have shown that power supply noise from these function blocks is considerably large. Therefore, it is possible to prevent the emission of power supply noise certainly by providing these function blocks with bypass capacitors.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENT

A preferred embodiment of the present invention will now be described with reference to the accompanying drawings.

Figure 1:
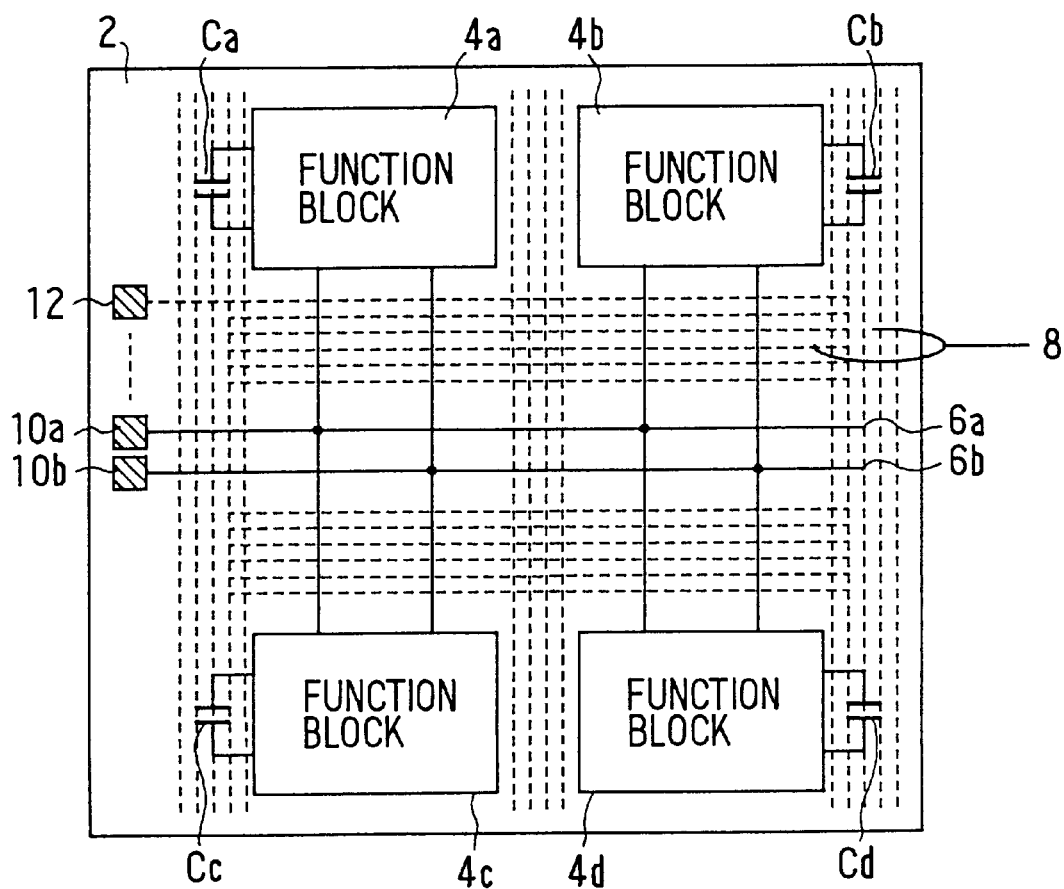
FIG. 1 is a view showing the construction of a semiconductor integrated circuit (IC) of a preferred embodiment of the present invention.

First, FIG. 1 is a view showing the construction of a semiconductor integrated circuit (IC) of this preferred embodiment.

As shown in FIG. 1, four different function blocks (for example a CPU block, an oscillating circuit block, a memory block and an input-output interface block) 4a, 4b, 4c, 4d, each of which has a predetermined signal processing function, are formed dispersed on a semiconductor substrate 2. Also formed on the semiconductor substrate 2 are positive and negative power supply lines 6a, 6b for supplying power to these function blocks 4a to 4d, multiple signal lines 8 for inputting and outputting various signals such as control signals and data signals to and from the function blocks 4a to 4d, power supply pads 10a, 10b for supplying power to the power supply lines 6a, 6b from outside, and multiple signal input/output pads 12 (of which only one is shown in the figure) for inputting and outputting signals between the signal lines 8 and the outside.

These pads 10a, 10b and 12 are respectively connected by bonding wires (not shown) to lead frames constituting power supply terminals and signal input and output terminals of the IC.

Also, in this preferred embodiment, bypass capacitors Ca, Cb, Cc and Cd having capacitances respectively set in correspondence with the current characteristics of the function blocks 4a to 4d are provided between the power supply lines 6a, 6b located in proximity to or inside the function blocks 4a to 4d.

Figure 2:
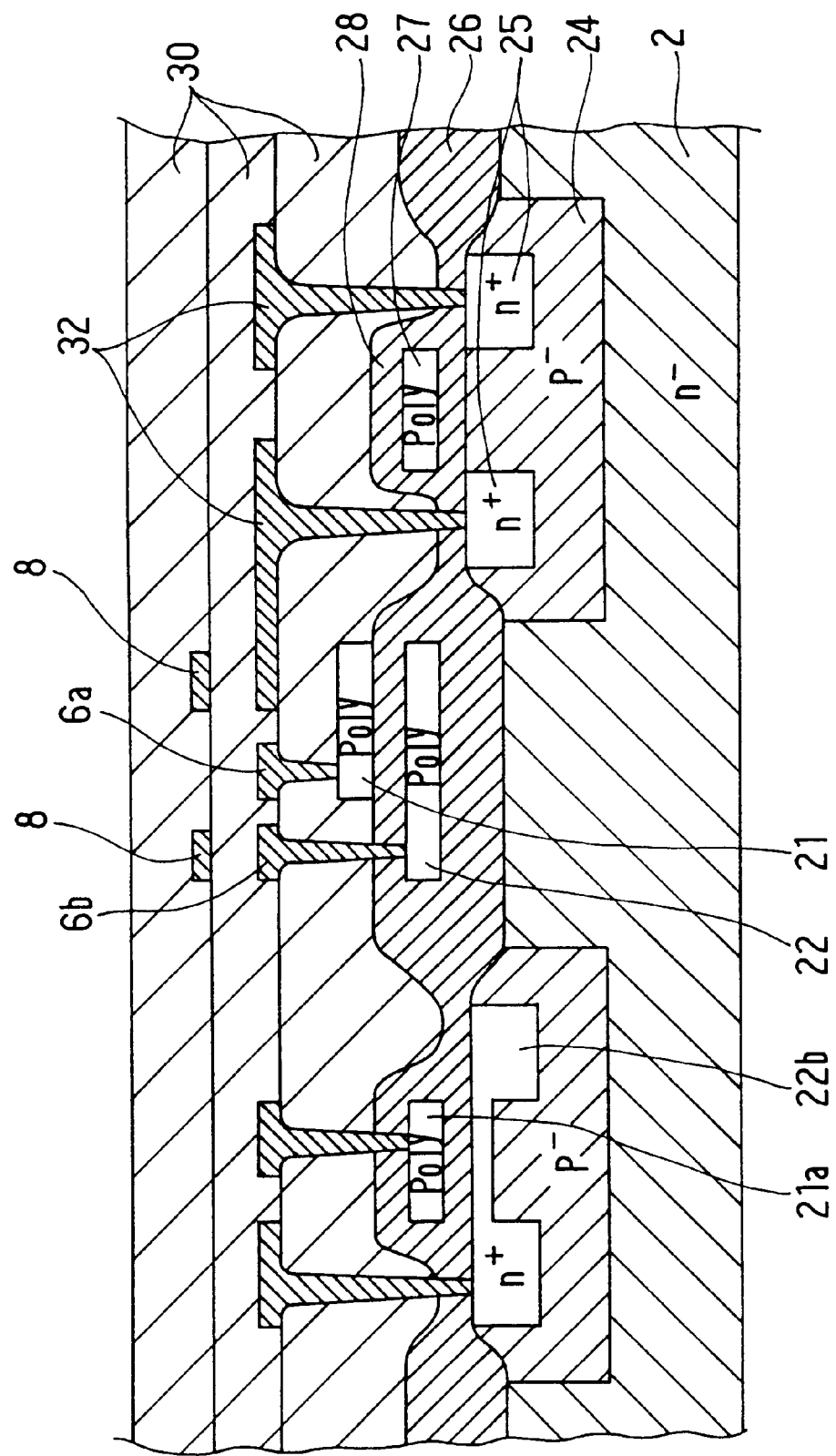
FIG. 2 is a sectional view showing constructions of bypass capacitors formed on the semiconductor substrate.

As shown in FIG. 2, the bypass capacitors Ca, Cb, Cc and Cd are made by forming two polycrystalline silicon (polysilicon) layers 21, 22 on the semiconductor substrate 2 in proximity to or inside the function blocks 4a to 4d. FIG. 2 is a sectional view of a semiconductor integrated circuit wherein an n⁻type monocrystalline silicon substrate is used as the semiconductor substrate 2 and bypass capacitors Ca to Cd are constructed on this semiconductor substrate 2 together with an n-channel MOSFET. The n-channel MOSFET is made by forming a p⁻type well region 24 and a pair of n⁺type diffusion regions 25 in the semiconductor substrate 2, laying an oxide film 26 thereon, forming a polysilicon layer 27 to constitute a gate electrode, and then forming an oxide film 28 on the polysilicon layer 27. As shown in FIG. 2, the bypass capacitors Ca to Cd are made by forming a polysilicon layer 22 to constitute one capacitor electrode on the oxide film 26 formed on the semiconductor substrate 2 and then, after forming the oxide film 28 thereon, forming a polysilicon layer 21 to constitute another capacitor electrode. These polysilicon layers 21, 22 constituting the capacitor electrodes are connected through connecting lines formed in an insulating layer 30 to positive and negative power supply lines 6a, 6b consisting of aluminum layers formed thereabove.

In FIG. 2, signal lines 8 consisting of aluminum layers are formed above the power supply lines 6a, 6b with the insulating layer 30 therebetween. Also, other aluminum layers formed at the same level as the power supply lines 6a, 6b are signal lines 32 inside the function block connected to the drain and source of the FET.

The bypass capacitors Ca to Cd may alternatively be formed as so-called MOS capacitances made up of a polysilicon layer 21a and an n$^+$type semiconductor layer 22b as shown in FIG. 2. The n$^+$type semiconductor layer constituting the electrode opposing the polysilicon layer 21a can be formed simultaneously with ion implantation for forming a ROM (Read Only Memory).

The capacitances of the bypass capacitors Ca to Cd are set in correspondence with the current characteristics of the respective function blocks 4a to 4d in the following way.

Figure 7:
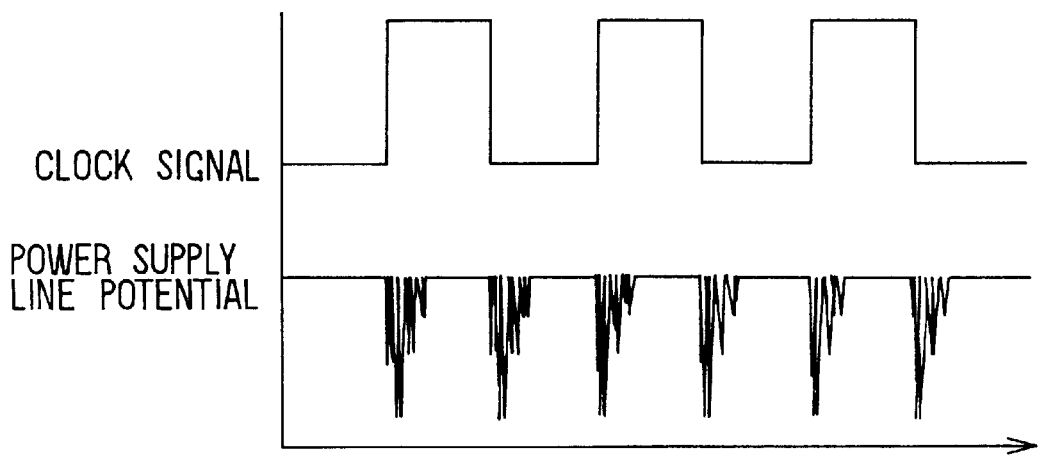
FIG. 7 is a view illustrating noise arising in power supply lines of an IC.

Because the function blocks 4a to 4d operate synchronously with a clock signal, between the power supply lines 6a, 6b in the vicinities of the function blocks 4a to 4d, a voltage drop occurs synchronously with their operations. Specifically, as shown in FIG. 7, the power supply potential falls to below the rated potential. This is because when the function blocks 4a to 4d operate synchronously with the clock signal, current is consumed in concentration at the point of change of the clock signal. This current change causes power supply noise (high-frequency noise). Therefore, to reduce the noise caused by this current change, it is necessary to set the capacitances of the bypass capacitors Ca to Cd to capacitance values such that they can supply the amounts of current consumed in the function blocks 4a to 4d. When the capacitance value is written Cx and the power supply voltage is written V, at the time of fluctuation of the power supply voltage the bypass capacitors Ca to Cd can supply a current of '$I=Cx \times dV/dt$' to the function blocks 4a to 4d. Accordingly, in this preferred embodiment, at the time of circuit design, the current consumed in each of the function blocks 4a to 4d is estimated, the capacitance value necessary to suppress a voltage fluctuation resulting from an estimated current change is calculated, and the respective bypass capacitors Ca to Cd are set to these capacitance values.

To secure these capacitance values, the bypass capacitors Ca to Cd are made up of a plurality of capacitors formed between the power supply lines 6a, 6b in proximity to or inside the function blocks 4a to 4d. That is, the required capacitance values are secured as overall capacitances of the plurality of capacitors.

From an investigation carried out by the present inventors it was found that, among function blocks, in the oscillating circuit block and the input-output interface block the voltage fluctuations are particularly large and power supply noise levels are high. Therefore, by providing the oscillating circuit block and the input-output interface block with bypass capacitors it is possible to suppress considerable power supply noise.

As described above, in the semiconductor integrated circuit of this preferred embodiment, the function blocks 4a to 4d formed on the semiconductor substrate 2 are provided with respective bypass capacitors Ca to Cd having capacitance values corresponding with the current characteristics of the respective function blocks 4a to 4d. As a result, power supply noise occurring in the power supply lines 6a, 6b due to cyclical current changes caused by the operation of the function blocks 4a to 4d can be suppressed and it is possible to prevent other function blocks from malfunctioning as a result of receiving this power supply noise.

Figure 3A:
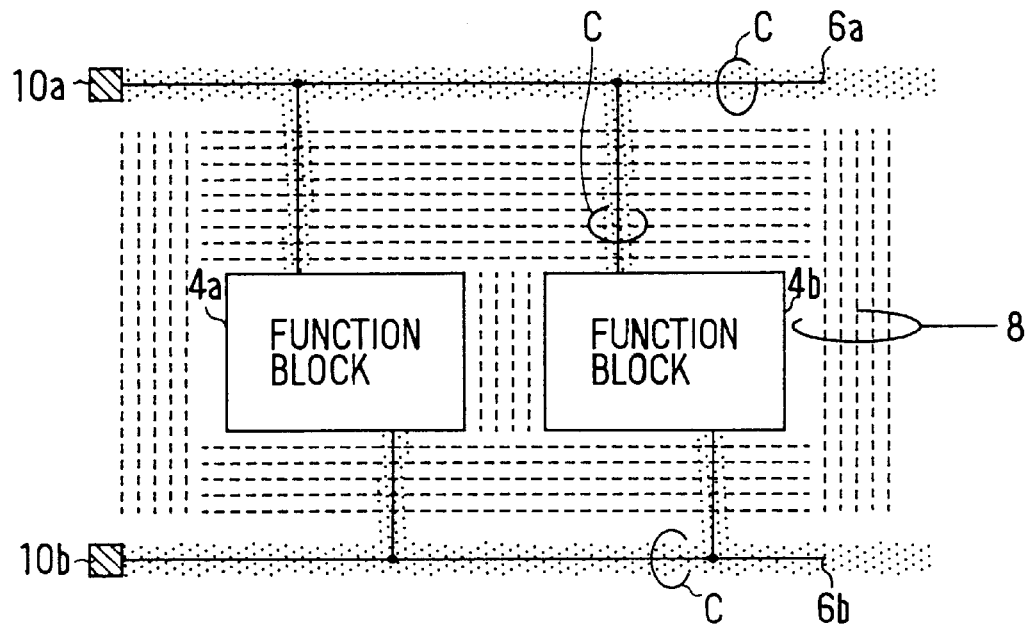
FIGS. 3A and 3B are views illustrating a noise reduction effect of bypass capacitors.
Figure 3B:
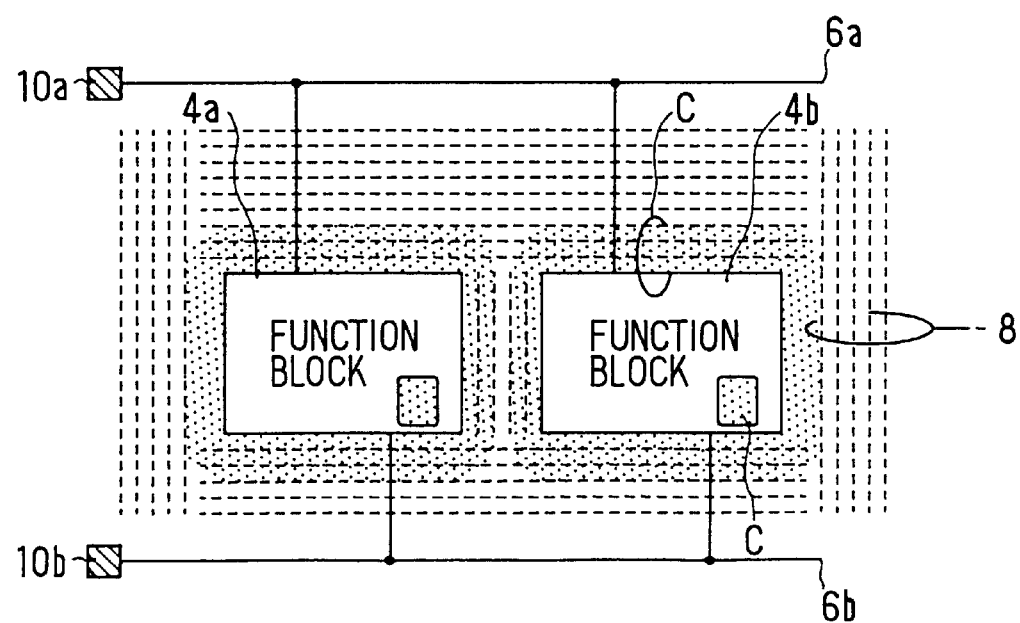

If a bypass capacitor is formed along a power supply line by utilizing the power supply line as one of its electrodes, as shown in FIG. 3A, the capacitance is dispersed in correspondence to the location of the power supply lines. As a result, the power supply line impedance component has great effect on the current changes as the result of the operations of the respective function blocks. Therefore, when the bypass capacitor is simply formed with only its capacitance being taken into account it is not possible to suppress power supply noise fully. Consequently, noise caused by the current changes of the function blocks leaks out into the power supply lines 6a, 6b and affects the operation of other function blocks. In this preferred embodiment, on the other hand, the bypass capacitors are formed with electrodes different from the power supply lines and also are disposed in proximity to or inside the function blocks, as shown in FIG. 3B. Therefore, a line impedance component affecting the reduction of the power supply noise can be minimized. Therefore, noise caused by current changes of the function blocks is fully absorbed by the bypass capacitors Ca to Cd and consequently it is possible to suppress noise leaking out from the function blocks into the power supply lines 6a, 6b, and therefore, the malfunctioning of the other function blocks caused by this power supply noise can be prevented. Also, because power supply noise occurring in the power supply lines 6a, 6b can be suppressed as described above, it is also possible to suppress power supply noise leaking out from the power supply lines 6a, 6b through the bonding wires and the lead frames to the outside.

Figure 4A:
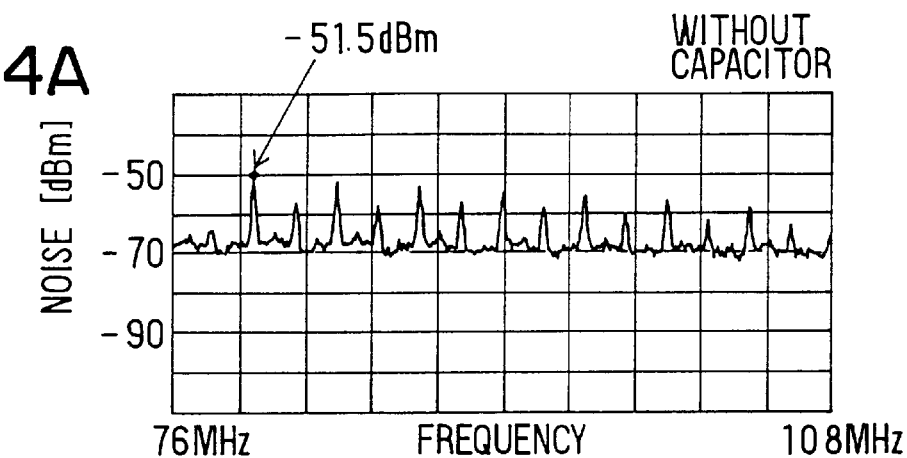
FIGS. 4A and 4B are graphs showing results obtained when levels of noise leaking to the outside through power supply terminals of a conventional IC (FIG. 4A) and an IC according to the present invention (FIG. 4B) were measured.
Figure 4B:
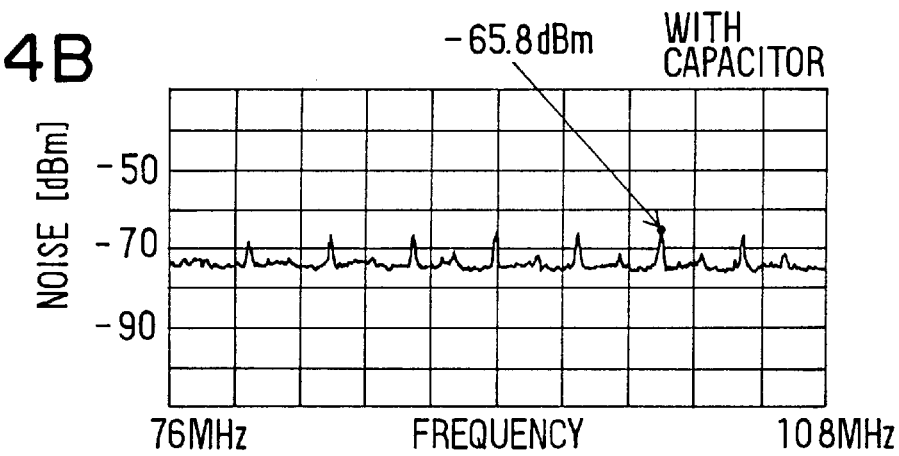

For example, FIGS. 4A and 4B show results obtained when an IC of the present preferred embodiment provided with bypass capacitors and a conventional IC not provided with bypass capacitors were respectively operated and noise in the 76 MHz to 108 MHz frequency band occurring between their power supply lead frames was measured with a spectrum analyzer. Whereas as in the conventional IC not having bypass capacitors the noise peak was −51.5 dBm, as shown in FIG. 4A, in the IC of the present preferred embodiment provided with bypass capacitors the noise peak was −65.8 dBm. Thus, it can be seen that the noise outputted to the outside from the power supply lines inside the IC can be reduced by more than 14 dBm.

In FIGS. 4A and 4B, the noise rises for each increase of 2 MHz in frequency; this is because the frequency of the operating clock signal of the IC is 4 MHz, and synchronously with the rising and falling (a frequency of 2 MHz) of the clock signal, noise having frequencies corresponding to integer multiples of that frequency (2 MHz) is produced.

Figure 5:
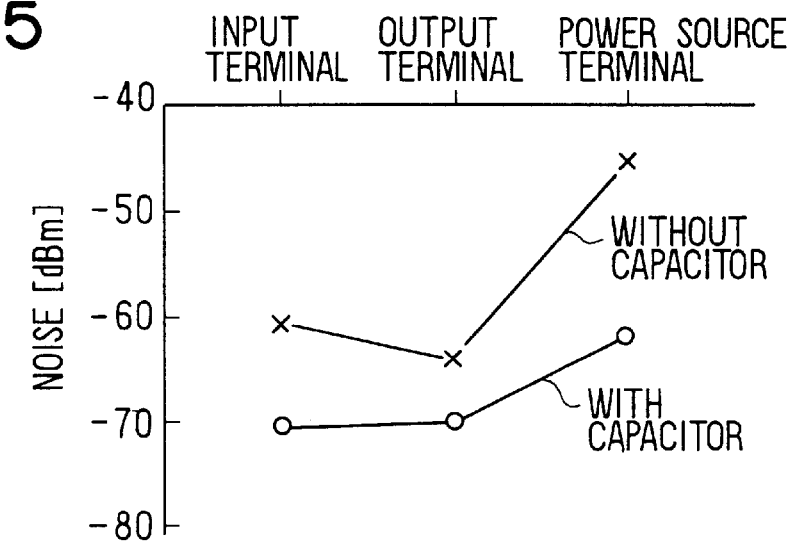
FIG. 5 is a graph showing results obtained when levels of noise leaking to the outside through power supply terminals, input terminals and output terminals were measured.

Also, with this preferred embodiment, because power supply noise occurring in the power supply lines 6a, 6b can be suppressed, it is also possible to suppress high-frequency noise leaking out to the outside through the signal input and output terminals of the IC. For example, FIG. 5 shows results obtained when an IC of the present preferred embodiment provided with bypass capacitors and a conventional IC not provided with bypass capacitors were respectively operated and levels of noise outputted through the signal input terminals, the signal output terminals and the power supply terminals of the IC were measured. From these measurement results also, it can be seen that by providing each of the function blocks inside the IC with a bypass capacitor not only it is possible to suppress high-frequency noise outputted to the outside through the power supply terminals of the IC but it is also possible to suppress high-frequency noise outputted to the outside through the terminals for signal input and output.

Figure 6:
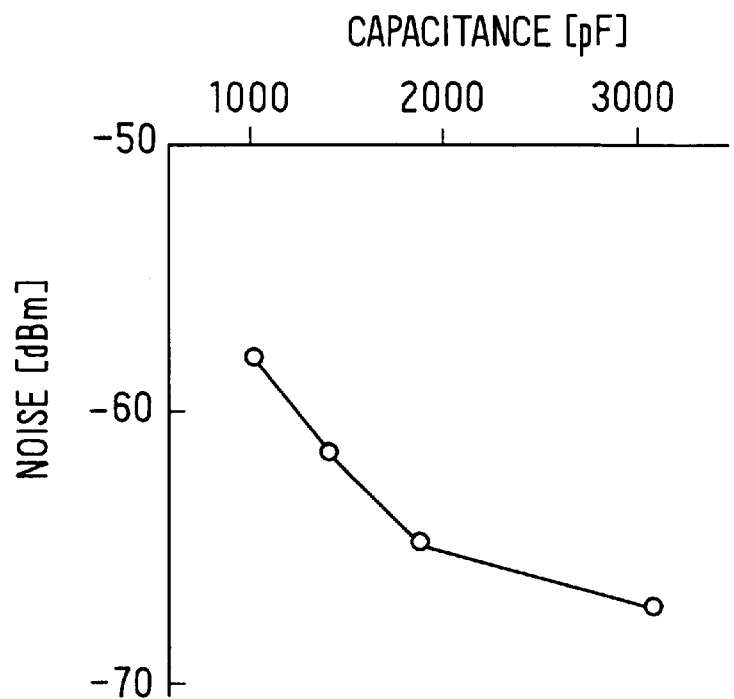
FIG. 6 is a graph showing results obtained when the relationship between the total capacitance of bypass capacitors provided in an IC and noise produced by the IC was measured.

When the relationship between the total capacitance value of the bypass capacitors provided inside the IC and noise level was measured, the measurement results shown in FIG. 6 were obtained. As can be seen from these measurement results, when the capacitance is small the noise level changes greatly with a small capacitance change. However, as the capacitance becomes larger the rate of change of the noise level with respect to a capacitance change becomes smaller. From these measurement results it can be seen that there is an optimum value of the capacitance of the bypass capacitor. Therefore, by setting the capacitance of the bypass capacitor to that optimum value it is possible to suppress noise optimally with a minimum necessary capacitance value.

In this preferred embodiment, because the capacitance of the bypass capacitor is set in correspondence with the consumed current characteristics of each of the function blocks, the capacitances of the bypass capacitors for reducing the power supply noise occurring as a result of the operation of the function blocks are not excessively large. Therefore, the number of bypass capacitors formed on the semiconductor substrate can be kept to the minimum necessary and it is possible to minimize the occurrence of leak current in the bypass capacitors and increase the productivity and reliability of the IC.

Also, because in this preferred embodiment the bypass capacitors Ca to Cd are made with two polysilicon layers 21, 22, the bypass capacitors Ca to Cd can be made not just in power supply line regions of the semiconductor substrate but also in signal line regions. Therefore, compared to a case wherein the bypass capacitors Ca to Cd are made by using diffusion layers formed in the semiconductor substrate, the degree of freedom with which the locations and capacitances of the bypass capacitors Ca to Cd are set can be raised and it is possible to increase the work facility of the design stage. Also, because it is not necessary to enlarge the power supply line region to provide capacitance, there is no increasing of the size of the semiconductor substrate nor consequent increasing of the cost of the IC.

The invention has been described above with reference to a specific preferred embodiment thereof, but the invention is not limited to the preferred embodiment described above and various other forms can be employed.

For example, although in the preferred embodiment described above the bypass capacitors Ca to Cd were described as ones made with two polysilicon layers 21, 22, for example a part of the bypass capacitor Ca to Cd may be made by using a diffusion layer formed in the semiconductor substrate and the bypass capacitor Ca to Cd is realized as an overall capacitance of these capacitors made with the diffusion layer and capacitors made with two polysilicon layers.

Also, although in the preferred embodiment described above an IC wherein four function blocks are formed on a semiconductor substrate 2 was described, the invention can be applied in the same way as in the above preferred embodiment to any IC having a plurality of function blocks and the same effects can be obtained.

What is claimed is:

1. A semiconductor integrated circuit comprising:
a plurality of function blocks constituted by an electronic circuit formed on a semiconductor substrate, each of which exhibits a specific function;
power supply lines for supplying power to said plurality of function blocks;
signal lines for inputting and outputting signals to and from said plurality of function blocks; and
bypass capacitors respectively provided to said plurality of function blocks, each of said bypass capacitors including first and second electrodes connected to said power supply lines and formed in proximity to or inside a corresponding function block, the first and second electrodes being different from the power supply lines,
wherein said power supply lines include first and second coplanar power supply lines respectively connected to said first and second electrodes.

2. A semiconductor integrated circuit according to claim 1, wherein said bypass capacitors are provided in an interconnection region between said function blocks.

3. A semiconductor integrated circuit according to claim 1, wherein said function blocks provided with said bypass capacitors include at least an oscillating circuit block.

4. A semiconductor integrated circuit according to claim 1, wherein said function blocks provided with said bypass capacitors include at least an input-output interface block.

5. A semiconductor integrated circuit according to claim 2, wherein said interconnection region has a multilayer structure and said bypass capacitors are disposed in a lower side layer of said multilayer structure and said first and second electrodes of each said bypass capacitor consist of two polysilicon layers disposed in said lower side layer with an insulating film interposed therebetween.

6. A semiconductor integrated circuit according to claim 1, further comprising a MOS transistor including a gate electrode that is coplanar with the first electrode of the bypass capacitor.

7. A semiconductor integrated circuit comprising:
a semiconductor substrate;
a function block for performing a specified function and including an electronic circuit formed on said semiconductor substrate;
first and second power supply lines for supplying power to said function block; and a bypass capacitor comprising opposing first and second electrodes each made of polysilicon and respectively connected to said first and second power supply lines, wherein said first and second power supply lines are coplanar with each other.

8. A semiconductor integrated circuit according to claim 7, wherein said bypass capacitor is positioned in proximity to or inside said function block.

9. A semiconductor integrated circuit according to claim 7, wherein said function block is an input-output interface block.

10. A semiconductor integrated circuit according to claim 7, wherein said first and second power supply lines are made of a material different from polysilicon.

11. A semiconductor integrated circuit comprising:

a semiconductor substrate;

a function block for performing a specified function and including an electronic circuit formed on said semiconductor substrate;

first and second power supply lines for supplying power to said function block; and a bypass capacitor comprising opposing first and second electrodes each made of polysilicon and respectively connected to said first and second power supply lines, wherein said function block is an oscillating circuit block.

* * * * *